United States Patent [19]

Manning

[11] Patent Number: 5,390,143
[45] Date of Patent: Feb. 14, 1995

[54] NON-VOLATILE STATIC MEMORY DEVICES AND OPERATIONAL METHODS

[75] Inventor: Monte Manning, Boise, Id.

[73] Assignee: Micron Semiconductor, Inc., Boise, Id.

[21] Appl. No.: 63,231

[22] Filed: May 17, 1993

[51] Int. Cl.⁶ .............................................. G11C 11/22
[52] U.S. Cl. ................................... 365/145; 365/156; 365/228; 257/295
[58] Field of Search ............... 365/145, 149, 154, 156, 365/190, 117, 228; 257/295

[56] References Cited

U.S. PATENT DOCUMENTS 4,809,225  2/1989  Dimmler et al. ............... 365/145

FOREIGN PATENT DOCUMENTS 702133   1/1965  Canada ........................ 365/145
4-141883 5/1992  Japan ......................... 365/145

OTHER PUBLICATIONS

Kazuo Itabashi et al., "A Split Wordline Cell For 16 Mb SRAM Using Polysilicon Sidewall Contacts," 1991, IEEE, pp. 17.4.1–17.4.3.

Primary Examiner—Joseph A. Popek
Attorney, Agent, or Firm—Wells, St. John, Roberts, Gregory & Matkin

[57] ABSTRACT

A non-volatile static read/write memory is formed by a bistable memory cell which is programmable to operate statically in one of two alternative output states, corresponding to binary output voltages. The static memory cell is formed by a pair of MOSFET inverters having cross-coupled inputs and outputs. A ferroelectric storage element fabricated from a material such as lead zirconate titanate or barium strontium titanate is positioned to be electrically polarized in one of two alternative orientations determined by the memory cell's output voltage. The ferroelectric storage element maintains its electric polarization upon power-down of the memory cell. Upon subsequent power-up of the memory cell, the ferroelectric storage element biases the memory cell toward one of the memory cell's two output states in accordance with the electric polarization of the ferroelectric storage element, and in accordance with the memory cell's output state at power-down.

14 Claims, 4 Drawing Sheets

NON-VOLATILE STATIC MEMORY DEVICES AND OPERATIONAL METHODS

TECHNICAL FIELD

This invention relates to non-volatile static memory devices.

BACKGROUND OF THE INVENTION

Figure 1:
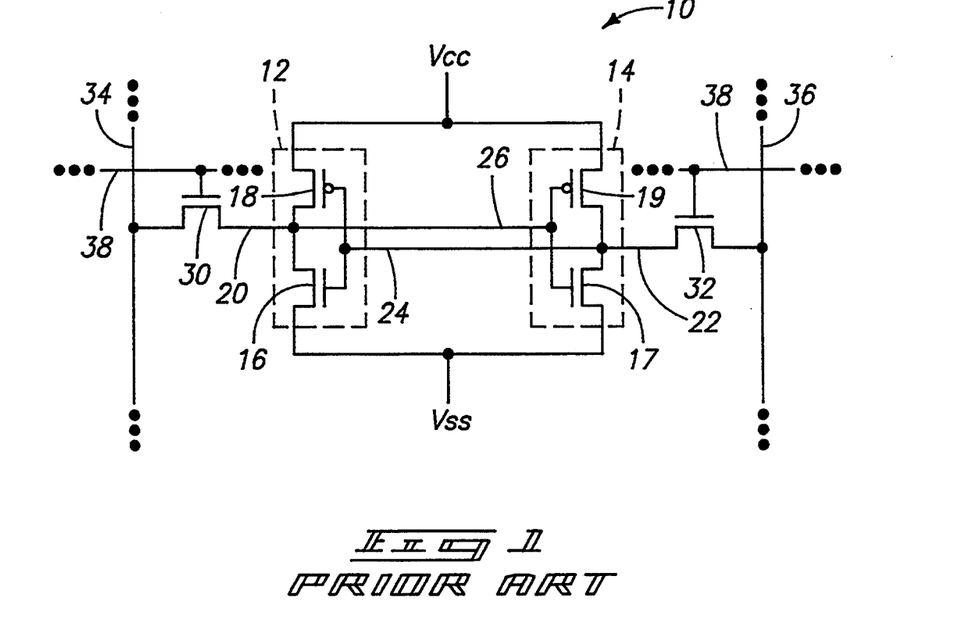
FIG. 1 is a schematic diagram of a prior art static memory cell.

FIG. 1 shows a prior art static read/write memory cell 10 such as is typically used in high-density static random access memories (SRAMs). A static memory cell is characterized by operation in one of two mutually-exclusive and self-maintaining operating states. Each operating state defines one of the two possible binary bit values, zero or one. A static memory cell typically has an output which reflects the operating state of the memory cell. Such an output produces a "high" voltage to indicate a "set" operating state. The memory cell output produces a "low" voltage to indicate a "reset" operating state. A low or reset output voltage usually represents a binary value of zero, while a high or set output voltage represents a binary value of one.

A static memory cell is said to be bistable because it has two stable or self-maintaining operating states, corresponding to two different output voltages. Without external stimuli, a static memory cell will operate continuously in a single one of its two operating states. It has internal feedback to maintain a stable output voltage, corresponding to the operating state of the memory cell, as long as the memory cell receives power.

The two possible output voltages produced by a static memory cell correspond generally to upper and lower circuit supply voltages. Intermediate output voltages, between the upper and lower circuit supply voltages, generally do not occur except for during brief periods of memory cell power-up and during transitions from one operating state to the other operating state.

The operation of a static memory cell is in contrast to other types of memory cells such as dynamic cells which do not have stable operating states. A dynamic memory cell can be programmed to store a voltage which represents one of two binary values, but requires periodic reprogramming or "refreshing" to maintain this voltage for more than very short time periods.

A dynamic memory cell has no internal feedback to maintain a stable output voltage. Without refreshing, the output of a dynamic memory cell will drift toward intermediate or indeterminate voltages, resulting in loss of data. Dynamic memory cells are used in spite of this limitation because of the significantly greater packaging densities which can be attained. For instance, a dynamic memory cell can be fabricated with a single MOSFET transistor, rather than the six transistors typically required in a static memory cell. Because of the significantly different architectural arrangements and functional requirements of static and dynamic memory cells and circuits, static memory design has developed along generally different paths than has the design of dynamic memories.

Static memory cell 10 generally comprises first and second inverters 12 and 14 which are cross-coupled to form a bistable flip-flop. Inverters 12 and 14 are formed by n-channel driver transistors 16 and 17, and p-channel load transistors 18 and 19. Driver transistors 16 and 17 are typically metal oxide silicon field effect transistors (MOSFETs) formed in an underlying silicon semiconductor substrate. P-channel transistors 18 and 19 are typically thin film transistors formed above the driver transistors.

The source regions of driver transistors 16 and 17 are tied to a low reference or circuit supply voltage, labelled $V_{ss}$ and typically referred to as "ground." Load transistors 18 and 19 are connected in series between a high reference or circuit supply voltage, labelled $V_{cc}$, and the drains of the corresponding driver transistors 16 and 17. The gates of load transistors 18 and 19 are connected to the gates of the corresponding driver transistors 16 and 17.

Inverter 12 has an inverter output 20 formed by the drain of driver transistor 16. Similarly, inverter 14 has an inverter output 22 formed by the drain of driver transistor 17. Inverter 12 has an inverter input 24 formed by the gate of driver transistor 16. Inverter 14 has an inverter input 26 formed by the gate of driver transistor 17.

The inputs and outputs of inverters 12 and 14 are cross-coupled to form a flip-flop having a pair of complementary two-state outputs. Specifically, inverter output 20 is cross-coupled to inverter input 26, and inverter output 22 is cross-coupled to inverter input 24. In this configuration, inverter outputs 20 and 22 form the complementary two-state outputs of the flip-flop.

A memory flip-flop such as that described typically forms one memory element of an integrated array of static memory elements. A plurality of access transistors, such as access transistors 30 and 32, are used to selectively address and access individual memory elements within the array. Access transistor 30 is an n-channel MOSFET having one active terminal connected to cross-coupled inverter output 20. Access transistor 32 is an n-channel MOSFET having one active terminal connected to cross-coupled inverter output 22. A plurality of complementary column line pairs, such as the single pair of complementary column lines 34 and 36 shown, are connected to the remaining active terminals of access transistors 30 and 32, respectively. A row line 38 is connected to the gates of access transistors 30 and 32.

Reading static memory cell 10 requires activating row line 38 to connect inverter outputs 20 and 22 to column lines 34 and 36. Writing to static memory cell 10 requires first placing selected complementary logic voltages on column lines 34 and 36, and then activating row line 38 to connect those logic voltages to inverter outputs 20 and 22. This forces the outputs to the selected logic voltages, which will be maintained as long as power is supplied to the memory cell, or until the memory cell is reprogrammed.

It is an accepted fact that most types of electronic read/write memories, including SRAMs, do not retain their programmed information without power being supplied. Even so-called "non-volatile" read/write memories retain their programming only because they include internal batteries. The batteries provide a rechargeable internal power source which is activated in the absence of external power.

In the specific case of static memory cells such as memory cell 10 described above, removing power causes a permanent loss of the binary information which had previously been stored. Upon subsequent power-up, numerous arbitrary and variable factors, such as the comparative capacitance and resistance associated with each of the inverters and their associated cross-couplings, determine whether an individual memory cell will begin operation in one state or the other. Thus, a memory array contains only random information upon power-up, and cannot be guaranteed to contain any information with which it had been programmed before power was removed.

The need for non-volatile storage is apparent from the popularity of battery-backed static memories. However, a non-volatile memory without associated backup batteries is needed and, if available, would find application in a great variety of products. The invention described below meets this need within a static memory array.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts." U.S. Constitution, Article 1, Section 8.

The invention includes operational methods for a read/write memory cell in a semiconductor integrated circuit, wherein the memory cell is of a type which is programmable to operate statically in one of two alternative output states. A preferred such method comprises:

applying power to the memory cell;
programming the memory cell to a power-down output state;
polarizing a ferroelectric storage element in one of two alternative polarization orientations in accordance with the memory cell's power-down output state;
removing power from the memory cell; and
subsequently re-applying power to the memory cell and simultaneously biasing the memory cell with the ferroelectric storage element toward a power-up output state, wherein the power-up output state corresponds to the power-down output state of the memory cell.

A non-volatile static read/write memory in accordance with a preferred embodiment of the invention comprises:

a bistable flip-flop which is capable of operating statically in one of two alternative output states;
a write circuit which is operably connected to the bistable flip-flop to program the bistable flip-flop to one of its two output states; and
a ferroelectric storage element, the ferroelectric storage element being positioned relative to the bistable flip-flop to be electrically polarized in one of two alternative orientations determined by the bistable flip-flop's output state, the ferroelectric storage element maintaining its electric polarization upon power-down of the flip-flop, the ferroelectric storage element biasing the bistable flip-flop upon flip-flop power-up toward one of the bistable flip-flop's two output states in accordance with the electric polarization of the ferroelectric storage element.

Figure 2:
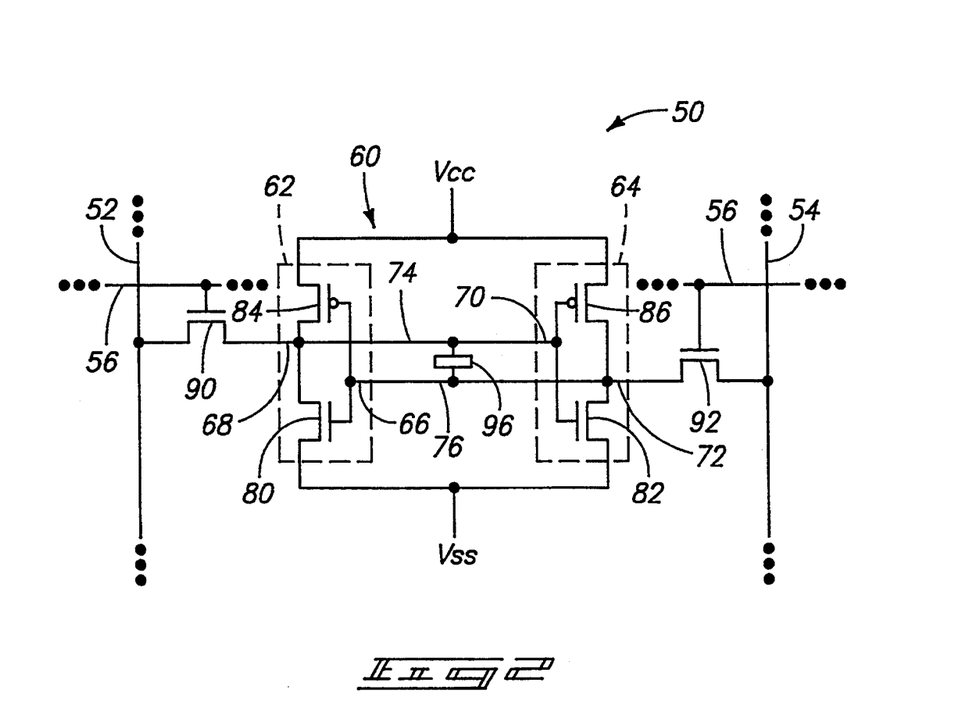
FIG. 2 is a schematic diagram of a non-volatile static memory cell in accordance with a first preferred embodiment of the invention.

FIG. 2 shows, in schematic form, a portion of a semiconductor integrated memory circuit in accordance with a preferred embodiment of the invention, generally designated by the reference numeral 50. Integrated memory circuit 50 includes a randomly-addressable memory array including a plurality of column lines such as complementary column lines 52 and 54 shown, a plurality of row lines such as row line 56, and a plurality of non-volatile memory cells 60. The row and column lines form an array of intersections. Memory cells 60 correspond to these intersections and are individually addressable through the appropriate row and column lines as described above.

Each memory cell 60 comprises a bistable or two-state flip-flop which is capable of operating statically in only one of two alternative output states, corresponding to a "set" or binary "1" state and a "reset" or binary "0" state. The memory cells are read/write cells, being both readable and writable upon receiving proper stimuli. They are programmable through the row and column lines with either of the two alternative output states. Once programmed, the memory cells maintain their programming, even after power is removed. The memory cells can also be repetitively altered or reprogrammed. Memory cell or flip-flop 60 has a pair of outputs which produce one of two alternative output voltages corresponding the two alternative flip-flop output states.

More specifically, each memory cell 60 comprises a pair of cross-coupled inverter circuits, referred to as first and second inverters 62 and 64. The inverters are connected to produce complementary bistable memory cell output voltages. First inverter 62 has an input 66 and an inverted output 68. Second inverter 64 has an input 70 and an inverted output 72. The inverters are cross-coupled by a pair of cross-couplings. A first cross-coupling 74 is connected between inverted output 68 of first inverter 62 and input 70 of second inverter 64. A second cross-coupling 76 is connected between inverted output 72 of second inverter 64 and input 66 of first inverter 62. Because of the cross-coupling, inverters 62 and 64 produce complementary logic or memory cell output voltages at the first and second cross-couplings 74 and 76, respectively.

Inverters 62 and 64 are formed by n-channel inverter or driver transistors 80 and 82, and corresponding p-channel load transistors 84 and 86. The source regions of driver transistors 80 and 82 are tied to a low reference or circuit supply voltage, labelled $V_{ss}$ and typically referred to as ground. Load transistors 84 and 86 are connected in series between a high reference or circuit supply voltage, labelled $V_{cc}$, and the drains of the corresponding driver transistors 80 and 8 gates of load transistors 84 and 86 are connected to the gates of driver transistor 80 and 82, respectively. Load transistors 84 and 86 are typically thin film devices formed in the integrated circuit over driver transistors 80 and 82.

Inverter output 68 is formed by the drain of driver transistor 80. Similarly, inverter output 72 is formed by the drain of driver transistor 82. Inverter input 66 is formed by the gate of driver transistor 80. Inverter input 70 is formed by the gate of driver transistor 82.

Access transistors 90 and 92 are connected to complementary memory cell outputs 68 and 72, respectively, to allow selective access for reading from or writing to memory cell 60. Access transistor 90 is an n-channel transistor having one active terminal connected to cross-coupled inverter output 68. Access transistor 92 is likewise an n-channel transistor having one active terminal connected to cross-coupled inverter output 72. Complementary column lines 52 and 54 are connected to the remaining active terminals of access transistors 90 and 92, respectively. Row line 56 is connected to the gates of access transistors 90 and 92. The row lines, complementary column lines, and access transistors form write circuits in integrated memory circuit 50 to program individual memory cells to operate in one of their two output states, and to produce a selected one of the two alternative memory cell output voltages.

A plurality of ferroelectric storage elements are electrically positioned relative to the memory cells or bistable flip-flops of memory circuit 50. An individual storage element 96 is preferably adjacent or connected to a flip-flop output 68 or 72, or to one of cross-couplings 74 or 76. Even more preferably, ferroelectric storage element 96 is connected as shown between outputs 68 and 72 or, equivalently, between cross-couplings 74 and 76. In this position, ferroelectric storage element 96 is electrically polarized during memory cell operation in one of two alternative orientations determined by and in accordance with the memory cell's output state—by the selected and programmed complementary logic voltages at flip-flop outputs 68 and 72 and at cross-couplings 74 and 76.

Ferroelectric storage element 96 comprises a region of ferroelectric material. It is generally fabricated from any one of a number of insulating ferroelectric materials which have recently become available. A ferroelectric material is a dielectric which exhibits spontaneous electric polarization of its electric dipoles or ferroelectric domains. The ferroelectric domains can be oriented predominantly in one direction by an appropriate external electric field. The polarized orientation will persist even after the external electric field is removed. Reversing the external field reverses the predominant orientation of the ferroelectric domains. Once polarized, ferroelectric material produces a corresponding electric field which can be imposed on external conductors.

Lead zirconate titanate is one preferred ferroelectric material for storage element 96. Barium strontium titanate is another ferroelectric material which could advantageously be used.

The ferroelectric material of storage element 96 is subjected to an external polarized electric field produced by at least one node of memory cell 60, wherein said node produces an electric field which is alternatively polarized in accordance with the output state of memory cell 60. This memory cell node forms polarizing means for electrically polarizing ferroelectric element 96 in one of two alternative orientations, determined by the memory cell's output state. Most preferably, storage element 96 is sandwiched between two complementary memory cell nodes such as complementary inverter cross-couplings 74 and 76. Subjecting storage element 96 to an aligned external field in this manner results in aligned and polarized ferroelectric domains within storage element 96. Because of the unique electrical properties of ferroelectric materials, storage element 96 maintains its electric polarization upon power-down of memory cell 60. In addition, it is positioned as described above to bias memory cell 60 upon memory cell power-up toward one of the memory cell's two output states, in accordance with the previous electric polarizition of ferroelectric storage element 96.

More specifically, during memory cell operation memory cell 60 is programmed to a selected output or logic state. In response, memory cell 60 produces corresponding complementary output logic voltages at its inverter cross-couplings 74 and 76, and at its outputs 68 and 72. Ferroelectric storage element 96 is electrically polarized in one of two different ferroelectric domain orientations by the complementary output voltages of cross-couplings 74 and 76, depending upon the selected output state. Ferroelectric storage element 96 maintains this "power-down" orientation until subsequent power-up of memory cell 60. With no power applied to memory cell 60, ferroelectric storage element 96 subjects inputs 66 and 70, through cross-couplings 74 and 76, to a polarized electric field. Upon power-up, the electric field produced by ferroelectric storage element 96 biases its adjacent first and second cross-couplings 74 and 76 toward a power-up voltage in accordance with the previous electrical polarization orientation of ferroelectric storage element 96. This biases memory cell 60 to a power-up output state equal to its power-down output state, in which memory cell 60 produces complementary power-up output voltages equal to the previous output voltages at memory cell power-down.

The physical construction and layout of an integrated circuit static memory cell may impact its operation in the context described above. Various factors, in addition to the electrical field produced by ferroelectric storage element 96, contribute to determining the power-up output state of memory cell 60. For instance, circuit capacitances and resistances affect the memory cell power-up output state, particularly if these factors are unbalanced between one or the other of inverters 62 and 64, or between cross-couplings 74 and 76. While ferroelectric storage element 96 can be fabricated on such a scale as to overcome the effects of such capacitive and resistive imbalances, it is preferable to minimize such imbalances in order to both reduce the area of needed ferroelectric materials and to increase the effectiveness and reliability of the ferroelectric materials actually used.

The preferred embodiment of the invention thus utilizes a symmetrical memory cell layout—the cross-coupled inverters of memory cell 60, including driver transistors 80 and 82 and corresponding thin film load transistors 84 and 86, have physical layouts and dimensions which are symmetrically equivalent to each other. This largely eliminates any source of imbalance between cross-coupled inverters 62 and 64, allowing ferroelectric storage element 96 to exert the strongest possible influence on the power-up state of memory cell 60.

Figure 3:
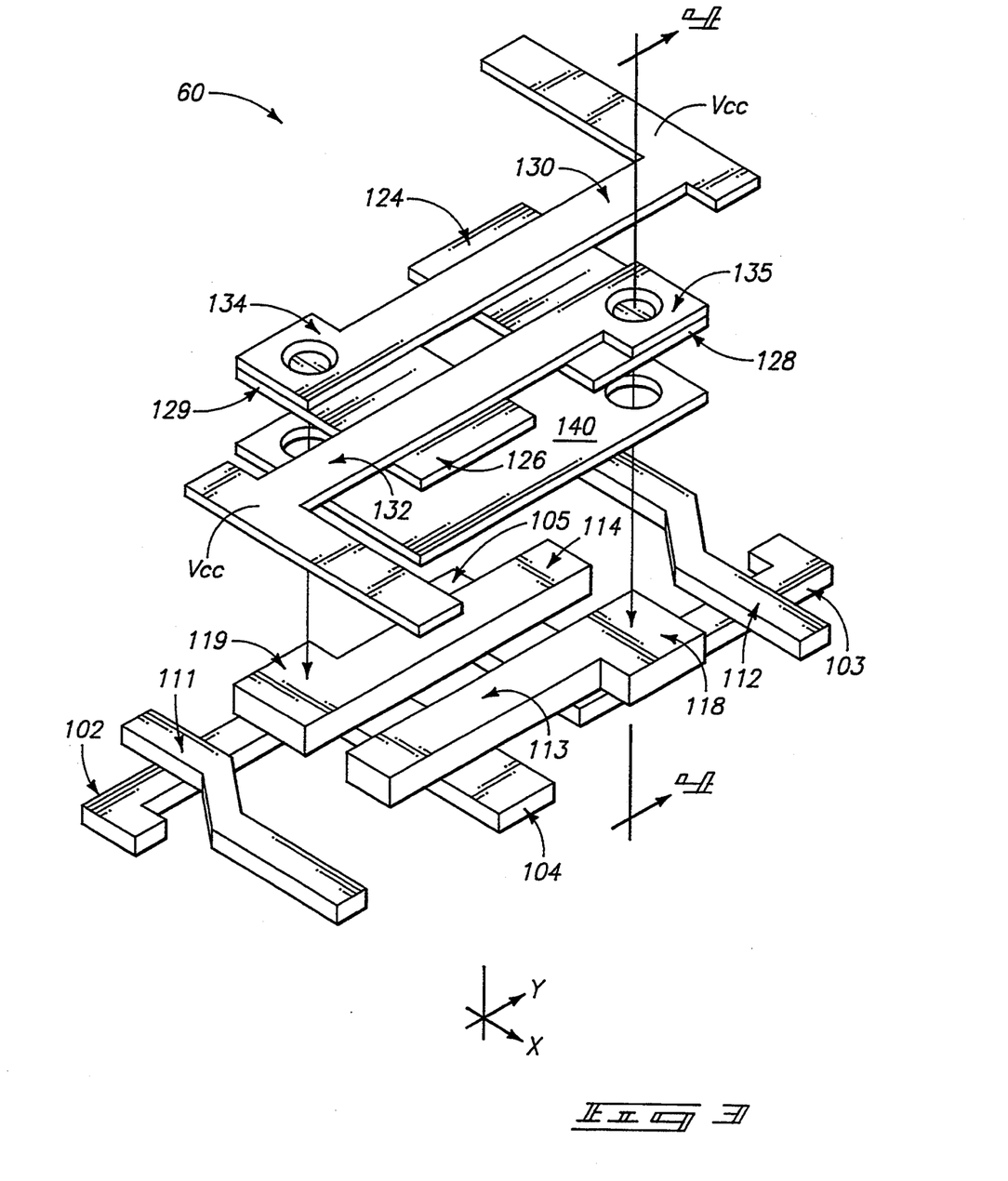
FIG. 3 is a simplified and exploded diagrammatic view of the static memory cell of FIG. 2.
Figure 4:
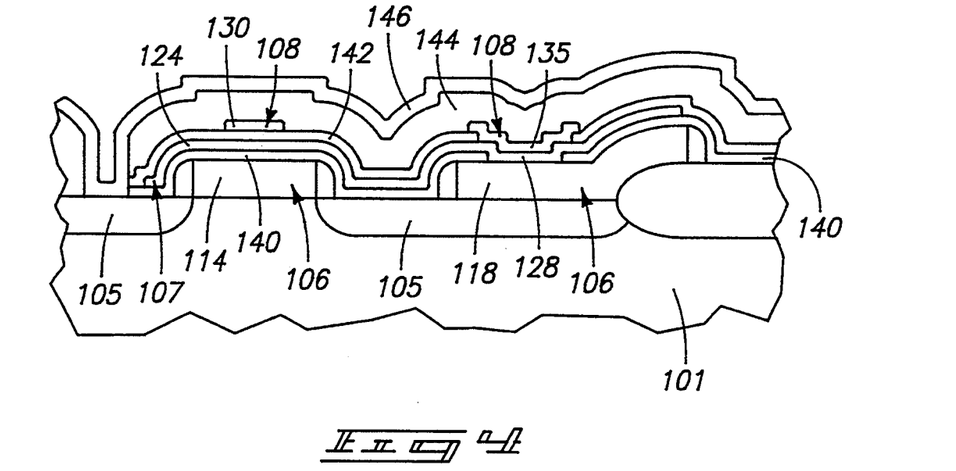
FIG. 4 is a cross-sectional diagrammatic view of the static memory cell of FIG. 2, taken along line 4—4 of FIG. 3.

FIGS. 3 and 4 show the physical construction and layout of memory cell 60. Active areas of access transistors 90 and 92 are formed along strips of an underlying bulk substrate 101, extending in a Y direction. The substrate regions forming the active areas of access transistors 90 and 92 are generally designated 102 and 103, respectively. The outer active regions of both of access transistors 90 and 92 are connected to column lines 52 and 54 (not shown in FIGS. 3 and 4). Active areas of driver transistors 80 and 82 are formed along strips of bulk substrate 101 which extend in an X direction, perpendicular to the Y direction. The substrate regions forming the active areas of driver transistors 80 and 82 are designated 104 and 105, respectively. The outer active regions of both of driver transistors 80 and 82 are connected to $V_{ss}$.

Gate regions corresponding to the underlying active regions of the access and driver transistors are formed in a first conductive polysilicon layer 106. The gate areas of access transistors 90 and 92 extend along the X direction, eventually connecting to row lines 56 (not shown in FIGS. 3 and 4). The gate area of access transistor 90 is formed in a region designated 111. The gate area of access transistor 92 is formed in a region designated 112.

The gate areas of driver transistors 80 and 82 extend in first polysilicon layer 106 along the Y direction. The gate area of driver transistor 80 is formed in a region designated 113. The gate area of driver transistor 82 is formed in a region designated 114. The polysilicon regions which form gate regions 113 and 114 of driver transistors 80 and 82 extend in the Y direction well beyond the corresponding underlying active areas to form driver gate connecting regions 118 and 119, respectively. These regions overly and contact active regions of access transistors 92 and 90, respectively.

Integrated circuit bulk substrate 101 is a p-type semiconductor such as doped silicon. It is implanted with n-type impurities to create the n-type active regions.

Thin film load transistors 84 and 86 are formed over driver transistors 80 and 82 in second and third conductive layers of polysilicon 107 and 108 which overly first conductive layer 106. The gates of load transistors 84 and 86 are formed by second polysilicon layer 107 to extend transversely over the gates of the underlying driver transistors, along the X direction. The gate of load transistor 84 is formed in second polysilicon layer 107 in .an area designated 124. The gate of load transistor 86 is formed in second polysilicon layer 107 in an area designated 126.

The regions of polysilicon which form load transistor gate regions 124 and 126 extend along the X direction to form load gate connecting regions 128 and 129. Load gate connecting regions 128 and 129 overly driver gate connecting regions 118 and 119. A dielectric material 140 is interposed between first and second polysilicon layers 106 and 107. Dielectric material 140 is etched beneath load gate connecting regions 128 and 129 to allow contact between load gate connecting regions 128 and 129 and driver gate connecting regions 118 and 119. Thus, the gates of driver transistor 80 and load transistor 84 are connected together, and the gates of driver transistor 82 and load transistor 86 are connected together.

Source and drain regions of thin film load transistors 84 and 86 are formed in third, polysilicon layer 108 by thin film body strips 130 and 132 extending along the Y direction over load transistor gate regions 124 and 126, respectively.

Thin film body strip 130 corresponds to load transistor 84, thus overlying load transistor gate region 124. Thin film body strip 130 extends beyond gate region 124, terminating in a connection to $V_{cc}$. Thin film body strip 130 also extends over load gate connecting region 129 of load transistor 86 to form a body connecting region 134. Body connecting region 134 contacts load gate connecting region 129.

Similarly, thin film body strip 132 corresponds to load transistor 86, thus overlying load transistor gate region 126. Thin film body strip 132 extends beyond gate region 126, terminating in a connection to $V_{cc}$. Thin film body strip 132 also extends over load gate connecting region 128 of load transistor 84 to form a body connecting region 135. Body connecting region 135 contacts load gate connecting region 128.

The construction described above results in the following elements being connected in common through contact between successive layers of polysilicon: one active region of access transistor 90 (formed in silicon substrate region 102); gate region 114 of driver transistor 82 (through connecting region 119); gate region 126 of load transistor 86 (through connecting region 129); and the drain region of load transistor 84 (formed by body strip 130 and connected through body connecting region 134). The following elements are also connected to each other through contact between successive layers of polysilicon: one active region of access transistor 92 (formed in silicon substrate region 103); gate region 113 of driver transistor 80 (through connecting region 118); gate region 124 of load transistor 84 (through connecting region 128); and the drain region of load transistor 86 (formed by body strip 132 and connected through body connecting region 135).

The cross-couplings of memory cell 60 are thus formed in the successive conductive layers of polysilicon. First cross-coupling 74 is formed by the noted vertical connections between gate regions 114 and 126 of driver transistor 82 and load transistor 86, and the drain regions of load transistor 84 and driver transistor 80. Second cross-coupling 76 is similarly formed by the vertical connections, noted above, between the gate regions 113 and 124 of driver transistor 80 and load transistor 84, and the drain regions of load transistor 86 and driver transistor 82. In accordance with the description given above, ferroelectric storage element 96 is electrically positioned between these two cross-couplings.

Generally, storage element 96 is positioned adjacent or between any two non-shorted elements forming the above cross-connections. Storage element 96 is physically formed in the preferred embodiment by dielectric layer 140. Dielectric layer 140 is preferably formed of a ferroelectric material such as lead zirconate titanate or barium strontium titanate positioned adjacent and between any two of first, second, and third conductive polysilicon layers 106, 107, and 108, and preferably adjacent and between first and second conductive polysilicon layers 106 and 107, to be electrically polarized thereby during operation of memory cell 60. This positioning is effectively between cross-couplings 74 and 76. Ferroelectric layer 140 also serves as a dielectric between first and second conductive layers 106 and 107.

Dielectric or ferroelectric layer 140 could conceivably be between or adjacent any two conductive layers of an SRAM cell. Preferably, however, the ferroelectric material should be between two SRAM conductive layers that are not shorted together. In the embodiment illustrated, the effective areas of ferroelectric material are between the gate of driver transistor 80 (gate region 113) and the gate of load transistor 86 (gate region 126); and the gate of driver transistor 82 (gate region 114) and the gate of load transistor 84 (gate region 124). Ferroelectric layer 140 is appropriately etched to allow the vertical connections noted above.

Memory cell 60 also includes a thin film dielectric layer 142 (not shown in FIG. 3), between second and third conductive layers 107 and 108, and a relatively thicker dielectric layer 144 overlying third conductive layer 108. A fourth conductive layer of polysilicon, connected to $V_{ss}$, overlies dielectric layer 144 as shown. Patterning and etching of the semiconductor devices is similar to that performed in conjunction with conventional SRAM cells.

Operation includes first applying power to memory cell 60. Normal operation involves numerous write and read operations to and from memory cell 60. Before memory cell power-down, however, memory cell 60 is programmed to a power-down output state. The power-down programming is not usually a special step, however. Rather, the power-down programming is simply the last write cycle before memory cell power down. The power-down programming polarizes ferroelectric storage element 96 in one of two alternative polarization orientations, in accordance with the power-down output state and its corresponding complementary output voltages. Subsequently, power is removed from memory cell 60 during a period of non-operation. This period can be relatively long, such as days or months. Ferroelectric storage element 96, however, retains its electric polarization during this powered-down time. Upon subsequently re-applying power to memory cell 60, ferroelectric storage element 96 biases memory cell 60 toward a power-up output state which corresponds to the previous power-down output state. This biasing is accomplished by subjecting at least one input of memory cell 60 to an electric field produced by the polarized ferroelectric element.

Figure 5:
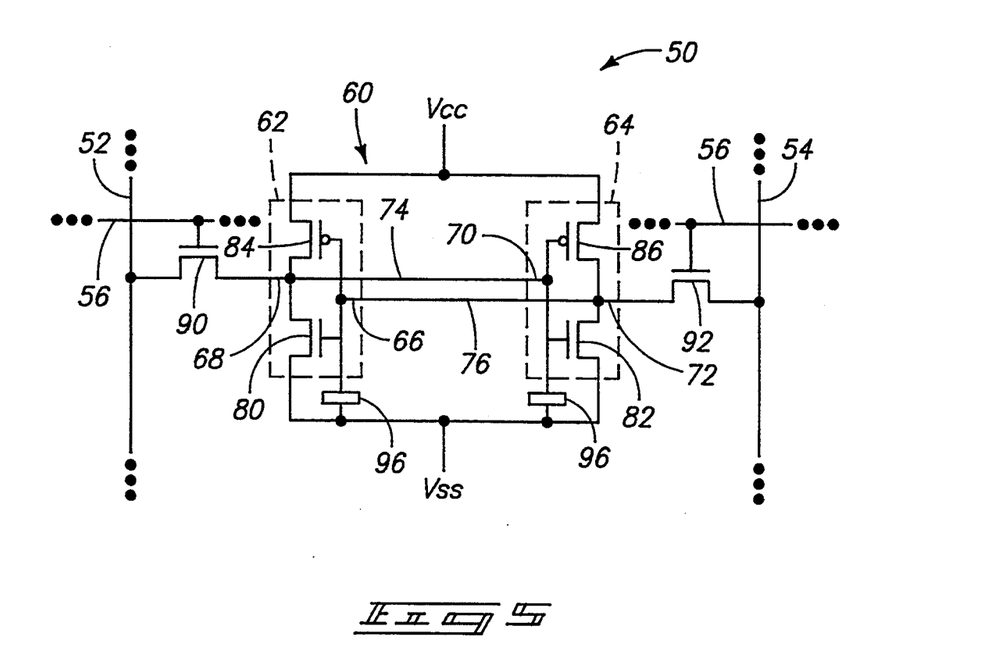
FIG. 5 is a schematic diagram of a non-volatile static memory cell in accordance with a second preferred embodiment of the invention.
Figure 6:
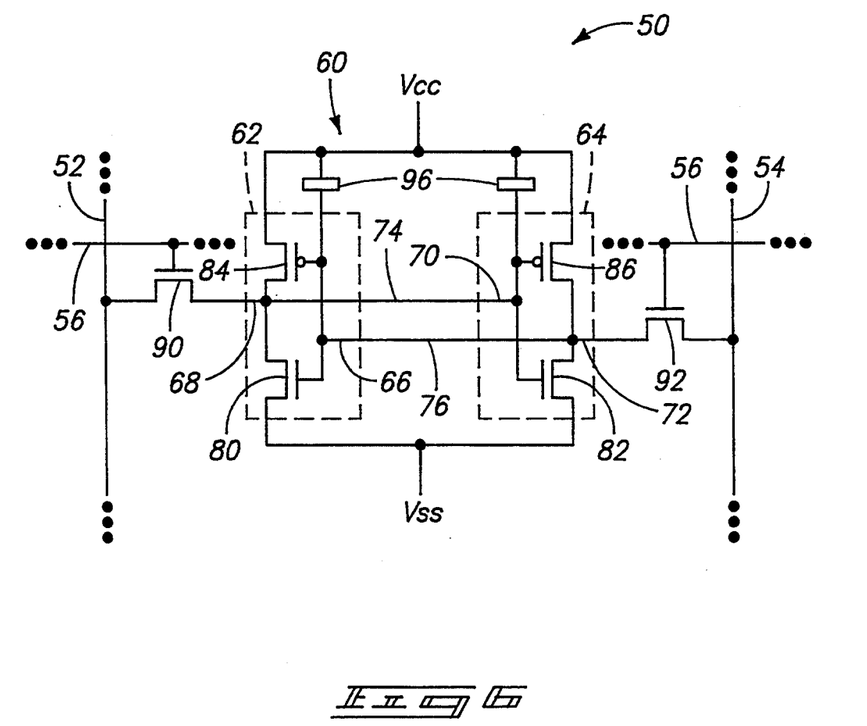
FIG. 6 is a schematic diagram of a non-volatile static memory cell in accordance with a third preferred embodiment of the invention.

FIGS. 5 and 6 show alternative embodiments of the invention, with different electrical positioning of ferroelectric storage element 96. In FIG. 5, for instance, a pair of ferroelectric storage elements 96 are used, with each such element being operably interposed between one of the cross-couplings and $V_{ss}$. In FIG. 6, a similar pair of ferroelectric storage elements 96 are connected between the cross-couplings and $V_{cc}$. Other variations are possible without departing from the principles set forth above.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. In a semiconductor integrated circuit containing a plurality of memory cells, a non-volatile static read/write memory cell comprising:
   a semiconductor substrate;
   a pair of cross-coupled driver transistors having active areas formed in the semiconductor substrate, the driver transistors having gates;
   a first conductive layer which forms the driver transistor gates; and
   a ferroelectric layer positioned physically adjacent the first conductive layer to be electrically polarized by the transistor gates formed by the first conductive layer during operation of the memory cell and to automatically bias the cross-coupled driver transistors upon memory cell power-up in accordance with the electric polarization of the ferroelectric layer.

2. A non-volatile static read/write memory cell as recited in claim 1 and further comprising:
   a thin film load transistor corresponding to each of the driver transistors, each load transistor having a gate region;
   a second conductive layer overlying the first conductive layer to form the thin film transistor gate regions;
   the ferroelectric layer being positioned physically between the first and second conductive layers to be electrically polarized thereby.

3. A non-volatile static read/write memory cell as recited in claim 1 wherein the cross-coupled driver transistors have physical layouts and dimensions which are symmetrically equivalent to each other.

4. In a semiconductor integrated circuit containing a plurality of memory cells, a non-volatile static read/write memory cell comprising:
   a semiconductor substrate;
   a pair of cross-coupled driver transistors having active areas formed in the semiconductor substrate, the cross-coupled driver transistors having gates;
   a pair of thin film load transistors corresponding to the driver transistors, the thin film load transistors having gate, source, and drain regions;
   a plurality of conductive layers which form the driver transistor gates and the load transistor gate, drain, and source regions; and
   a ferroelectric layer formed physically adjacent one of said plurality of conductive layers to be electrically polarized thereby during operation of the memory cell and to bias the cross-coupled driver transistors upon memory cell power-up in accordance with the electric polarization of the ferroelectric layer.

5. A non-volatile static read/write memory cell as recited in claim 4 wherein the cross-coupled driver transistors and corresponding thin film load transistors have physical layouts and dimensions which are symmetrically equivalent to each other.

6. A non-volatile static read/write memory cell as recited in claim 4 wherein the ferroelectric layer is positioned physically adjacent and between two of said plurality of conductive layers.

7. A non-volatile static read/write memory cell as recited in claim 4 wherein the plurality of conductive layers includes:
   a first conductive layer forming the driver transistor gates;
   a second conductive layer forming the load transistor gate regions;
   a third conductive layer forming the load transistor source and drain regions;
   the ferroelectric layer being positioned adjacent at least one of the first, second, and third conductive layers.

8. A non-volatile static read/write memory cell as recited in claim 7 wherein the ferroelectric layer is positioned physically adjacent the first conductive layer to be electrically polarized by the driver transistor gates.

9. A non-volatile static read/write memory cell as recited in claim 7 wherein the ferroelectric layer is positioned physically adjacent the second conductive layer to be electrically polarized by the load transistor gate regions.

10. A non-volatile static read/write memory cell as recited in claim 7 wherein the ferroelectric layer is positioned physically between the first and second conductive layers to be electrically polarized by the driver transistor gates and by the load transistor gate regions.

11. In a semiconductor integrated circuit containing a plurality of memory cells, a non-volatile static read/write memory cell comprising:

a semiconductor substrate;

a pair of driver transistors formed over the semiconductor substrate, the driver transistors being cross-coupled to form a bi-stable flip-flop;

the driver transistors including at least a first conductive layer which forms gates of the driver transistors;

at least one ferroelectric layer positioned physically adjacent the first conductive layer to be electrically polarized thereby during operation of the bi-stable flip-flop and to bias the driver transistors upon flip-flop power-up in accordance with the electric polarization of the ferroelectric layer.

12. A non-volatile static read/write memory cell as recited in claim 11 and further comprising:

a load transistor corresponding to each driver transistor;

the load transistors including at least a second conductive layer which forms gates of the load transistors; the ferroelectric layer being sandwiched between the first and second conductive layers.

13. In a semiconductor integrated circuit containing a plurality of memory cells, a non-volatile static read/write memory cell comprising:

a semiconductor substrate;

a pair of driver transistors formed over the semiconductor substrate, the driver transistors being cross-coupled to form a bi-stable flip-flop;

a load transistor coupled to each driver transistor, the coupled driver and load transistors forming a pair of inverters;

a plurality of conductive regions which form gate and active regions of the driver and load transistors, the conductive regions being positioned to form a pair of conductive cross-couplings between the pair of inverters;

a ferroelectric layer positioned physically adjacent at least one of the conductive cross-couplings to be electrically polarized thereby during operation of the inverters and to automatically bias the inverters upon memory cell power-up in accordance with the electric polarization of the ferroelectric layer.

14. A non-volatile static read/write memory cell as recited in claim 13 wherein the ferroelectric layer is positioned physically between the conductive cross-couplings.

* * * * *

UNITED STATES PATENT AND TRADEMARK OFFICE
CERTIFICATE OF CORRECTION

PATENT NO. : 5,390,143

DATED : February 14, 1995

INVENTOR(S) : Monte Manning

It is certified that error appears in the above-indentified patent and that said Letters Patent is hereby corrected as shown below:

Column 1, line 4, insert the following:

-- This invention was made with Government support under Contract No. MDA972-92-C-0054 awarded by Advanced Research Projects Agency (ARPA). The Government has certain rights in this invention. --

Signed and Sealed this

Twenty-third Day of May, 1995

*Attest:*

BRUCE LEHMAN

*Attesting Officer*     *Commissioner of Patents and Trademarks*